United States Patent [19]

Stuby

[11] 4,391,034

[45] Jul. 5, 1983

[54] THERMALLY COMPENSATED SHADOW MASK

[75] Inventor: Kenneth P. Stuby, Catlett, Va.

[73] Assignee: IBM Corporation, Armonk, N.Y.

[21] Appl. No.: 218,910

[22] Filed: Dec. 22, 1980

[51] Int. Cl.$^3$ .................. H01L 5/00; H01L 7/10; H01L 7/54
[52] U.S. Cl. ................... 29/579; 118/504; 204/192 E; 204/298; 427/248.1; 427/250; 427/255; 427/299
[58] Field of Search ............. 427/248.1, 255, 250, 427/272, 282, 299, 82, 91, 8, 9; 118/504, 505, 720, 721; 204/192 E, 298; 29/579

[56] References Cited

U.S. PATENT DOCUMENTS

| | | |
|---|---|---|
| 3,117,025 | 1/1964 | Learn et al. .................. 118/504 |
| 3,401,055 | 9/1968 | Langdon et al. .............. 427/89 |
| 3,410,774 | 11/1968 | Barson et al. ................ 65/32 |
| 3,526,555 | 9/1970 | Alexander .................... 118/504 |
| 3,664,295 | 5/1972 | Ng et al. ..................... 118/720 |
| 3,897,324 | 7/1975 | Del Monte et al. ........... 118/504 |
| 4,096,821 | 6/1978 | Greeneich et al. ............ 118/720 |
| 4,278,710 | 7/1981 | Jelks .......................... 427/282 |

OTHER PUBLICATIONS

Krongelb, S., "Evaporation Mask for Mask Changing and Registration Under Vacuum", IBM Tech. Discl. Bulletin, vol. 14, No. 3, Aug. 1971, pp. 772–773.
IBM Tech. Disclosure Bulletin, vol. 19, No. 7, Dec. 1976, p. 2517.

*Primary Examiner*—S. L. Childs
*Attorney, Agent, or Firm*—Maurice H. Klitzman

[57] ABSTRACT

In vacuum sputter cleaning and plating operations forming a patterned metallic layer on a silicon semiconductor chip, alignment is maintained by anticipating the difference in thermal expansion between the molybdenum mask and the silicon chip and forming the apertures in the molybdenum mask in a radially offset position with respect to the intended cleaning and deposition locations on the semiconductor chip, when the mask and the chip are at room temperature. Then, when the mask and the silicon chip are maintained in a concentric position and are raised to the cleaning and deposition temperature, the differential expansion of the molybdenum mask will bring the apertures therein into perfect alignment with the intended deposition locations on the silicon wafer.

3 Claims, 5 Drawing Figures

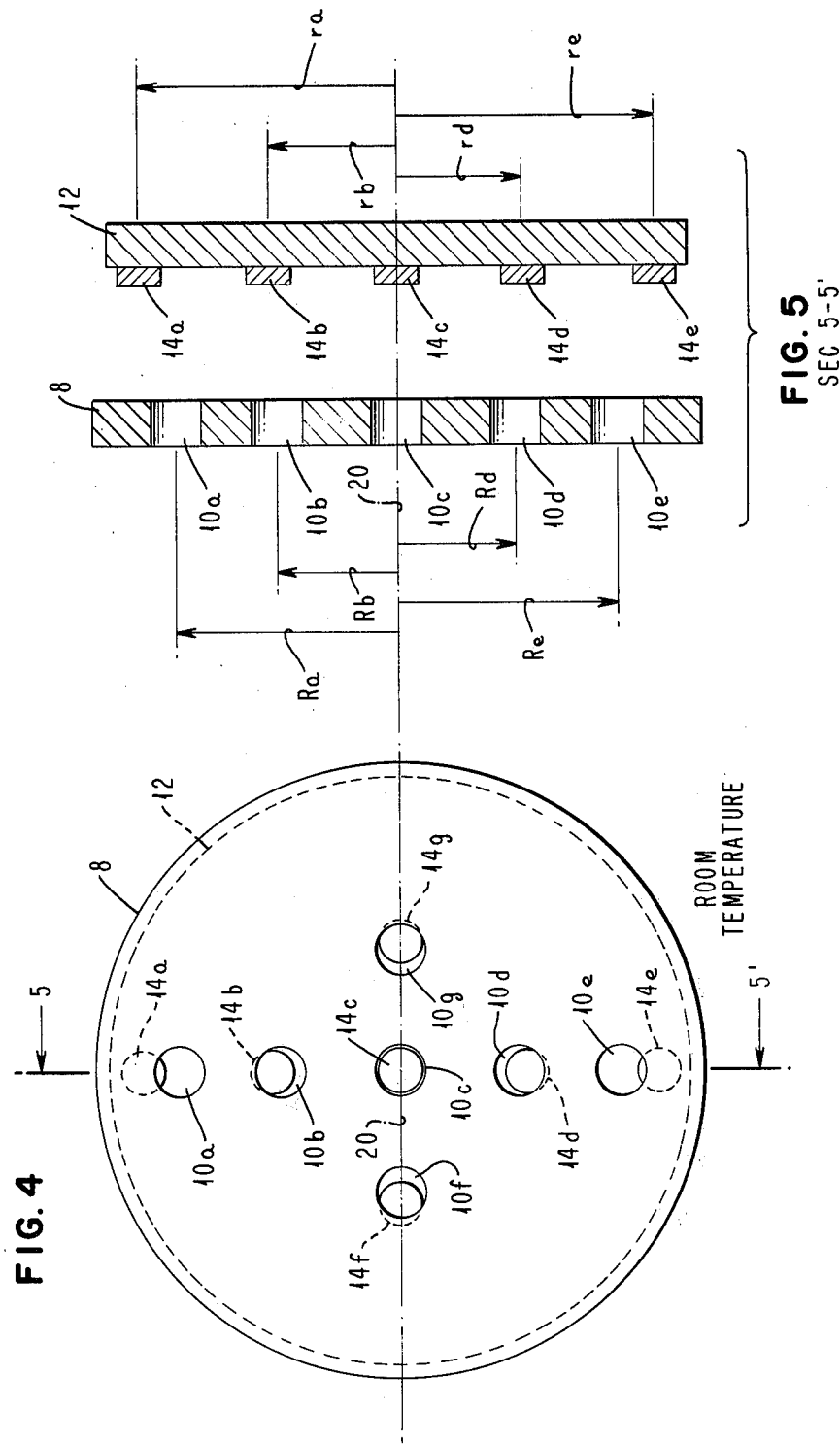

THERMALLY COMPENSATED SHADOW MASK

FIELD OF THE INVENTION

The invention disclosed broadly relates to semiconductor processing apparatus and more particularly relates to improvements in semiconductor masking techniques.

BACKGROUND OF THE INVENTION

Vacuum sputter cleaning techniques and vacuum plating cleaning techniques have been widely employed in the prior art to fabricate semiconductor devices. For example, U.S. Pat. No. 3,410,774 to Barson, et al, assigned to the instant assignee, describes a method and apparatus for reverse sputtering selected electrically exposed areas of a cathodically biased work piece in order to clean the exposed areas. U.S. Pat. No. 3,401,055 to Langdon, et al, assigned to the instant assignee, discloses a method of vacuum vapor depositing a metal layer through a mask located between the substrate to be plated and the evaporation source. In such prior art vacuum technology applications to semiconductor device fabrication, a semiconductor substrate 12, composed of a material such as silicon, is covered by an insulating layer 7 having a window 11 therethrough exposing a preformed electrode 9, as shown in FIG. 1. In this example, a first step of the operation is to deposit a layer of metal alloy 13 onto the electrode 9 to serve as the base for a solder contact 14 for subsequent joining to a semiconductor module, as is shown in FIG. 2. The prior art process and apparatus for carrying out this deposition is illustrated in FIG. 3, wherein a vacuum chamber 1 capable of sustaining a vacuum within its confines 2, by means of a vacuum pump 3, supports an anode 4, the mask 8, and the substrate 12, as shown. In order to clean the electrode layer 9 prior to the deposition of the metal alloy layer 13, an inert gas is introduced into the chamber 2 from the reservoir 7 and is ionized at the anode 4, producing the ions 6. The power supply 5 has its positive pole connected to the anode 4 and its negative pole connected to the mask 8 and the semiconductor wafer 12 so that the ions 6, which are charged, will be accelerated toward the mask 8. Those ions which are aligned with the windows 10 in the mask 8 will be propelled through the windows 10 toward the semiconductor substrate 12 and will collide with the surface of the metal electrode layer 9, thereby removing any unwanted oxide coating so as to perform the desired cleaning operation. The process of carrying out this reverse sputtering cleaning operation raises the temperature of the mask 8 and of the substrate 12. Since the mask 8 must undergo repeated exposures to the corrosive field of accelerated ions 6 during repeated usages of the sputtering apparatus, the mask 8 must be composed of a material which is highly resistant to sputtering, for example molybdenum. Although the coefficient of thermal expansion for molybdenum, which is $\alpha_{Mo} = 5.5 \times 10^{-6}/°$ C., is greater than the coefficient of thermal expansion for silicon, which is $\alpha_{Si} = 3.0 \times 10^{-6}/°$ C., since prior art applications of the sputtering process were directed to relatively small overall dimensions for the workpiece 12 and permitted relatively large tolerances for the resulting image position, the difference in the coefficient of thermal expansion for the mask 8 and the silicon substrate 12 was not considered to be significant. This is born out by the comment by Barson, et al, at column five, lines 51 through 55.

However, when the prior art reverse sputtering cleaning operation is applied to a relatively large semiconductor wafer having refined manufacturing tolerances, the differential expansion between the molybdenum mask and the semiconductor substrate 12 over the resultant temperature excursion of between room temperature and approximately 300° centigrade, causes a substantial yield loss due to the resultant inaccuracy in the image positioning. This problem is compounded when vacuum metal evaporation of the layers 13 and 14 is desired to immediately follow the reverse sputter cleaning operation, since the resultant location of the deposited layers 13 and 14 will not coincide with the location of the window 11 exposing the electrode 9 on the semiconductor substrate 12.

One technique for reducing the effects of this problem is disclosed in the publication by C. E. Benjamin, "FIXTURE DESIGN TO REDUCE METAL MASK/SILICON WAFER THERMAL MISMATCH EFFECTS," *IBM Technical Disclosure Bulletin*, Vol. 19, No. 7, December 1976. In this publication, tooling reduces the misalignment problems inherent in heated-substrate metal-masked evaporation of semiconductor device wafer thin-film patterns by up to a factor of 2 over previous designs. It employs a technique for constraining a spring-bias clamped silicon wafer 12 and metal evaporation mask 8 to expand thermally only in a radial direction, without obscuring any mask or wafer active areas. This technique forces the mask 8 and spring to expand only radially. Three pins and oblong slots in both the mask and spring are used. They are roughly equally spaced (about 120° apart) around a circle. The long axes of the slots are radial, so that expansion of the mask and spring exert forces against the sides of the slots, making any movement only radial, with the centers effectively fixed with respect to the tooling. The peripheries of both the mask and spring "float" vertically and are horizontally constrained only by the pins in the radial slots, effectively tying the center of the wafer 12 to the center of the mask 8 and permitting unconstrained radial expansion (at different rates) of all parts. The base makes contact with the top ring outside the peripheries of the mask 8, wafer 12 and spring so that the mask is only pressed against the bottom surface of the top ring by pressure (through the wafer) from the leaf spring. The net result of constraining the centers of the mask 8 and wafer 12 together is that the maximum thermal mismatch during a hot-substrate evaporation will be only half that which exists when the mask 8 and wafer 12 are constrained at a point on (or near) the periphery. This is important from a device reliability point of view, since such misalignment while hot during evaporation can cause the metal alloy layer 13 to incompletely cover via hole 11, resulting in gross intermetallic formation and subsequent contact failure.

Although this technique can reduce by a factor of two, the effects of thermal coefficient of expansion mismatch, the resultant misalignments for the new larger semiconductor wafers and smaller semiconductor chip structures still produce significant production yield losses. Furthermore, if there is a non-uniform spring pressure around the periphery of the wafer due to the presence of foreign matter, then the point where the mask and wafer are relatively stationary is no longer the centroid of the mask but, instead, the point will be along its edge. This negates any improvement which the fixture might otherwise provide to the misalignment problem.

OBJECTS OF THE INVENTION

It is therefore an object of the invention to provide an improved technique for sputter cleaning a semiconductor substrate.

It is still a further object of the invention to provide an improved technique for evaporative plating a layer on a semiconductor substrate.

It is yet another object of the invention to provide an improved technique for shadow masking at an elevated temperature.

It is still another object of the invention to reduce the average misalignment between a high temperature shadow mask and workpiece.

SUMMARY OF THE INVENTION

These and other objects, features and advantages of the invention are accomplished by the thermally compensated shadow mask, disclosed herein. In vacuum sputter cleaning and plating operations forming a patterned metallic layer on a silicon semiconductor chip, an alignment problem arises due to the difference in the thermal expansion between the molybdenum shadow mask used in the operation and the silicon material of the semiconductor chip itself. This problem is solved by anticipating the difference in thermal expansion between the molybdenum mask and the silicon chip and forming the apertures in the molybdenum mask in a radially offset position with respect to the intended cleaning and deposition locations on the semiconductor chip, when the mask and the chip are at room temperature. Then, when the mask and the silicon chip are maintained in a concentric position and are raised to the cleaning and deposition temperature, the differential expansion of the molybdenum mask will bring the apertures therein into perfect alignment with the intended deposition locations on the silicon wafer. An unexpected result of the radially offset structure for the shadow mask is that even if the mask and wafer are not maintained in a mutually concentric position, the mask's radially offset aperture pattern will reduce the average total misalignment and the maximum misalignment over all of the mask apertures and predeposited wafer structures. This enables a much larger workpiece to be accommodated while maintaining a minimum manufacturing tolerance for the resultant alignment of the deposited metal layer with respect to the location of predefined structures on the semiconductor substrate.

DESCRIPTION OF THE FIGURES

These and other objects, features and advantages of the invention will be more fully appreciated with reference to the accompanying figures.

FIG. 4 is a front view of a shadow mask behind which is located the semiconductor wafer on whose surface the sputter cleaning and vapor deposition operations are to be performed.

FIG. 5 is a cross-sectional view along the section line 5—5 prime of FIG. 4.

DISCUSSION OF THE PREFERRED EMBODIMENT

In vacuum sputter cleaning and plating operations for forming a patterned layer on a silicon semiconductor chip, an alignment problem arises due to the difference in the thermal expansion between the molybdenum shadow mask used in the operation and the silicon material of the semiconductor chip itself. This problem is solved by anticipating the difference in the thermal expansion between the molybdenum mask and the silicon chip and forming the apertures in the molybdenum mask in a radially offset position with respect to the intended cleaning and deposition locations on the silicon chip, when the mask and the chip are at room temperature. Then, when the mask and silicon chip are maintained in a mutually concentric position and are raised to the cleaning and deposition temperature, the differential expansion of the molybdenum mask will bring the apertures therein into perfect alignment with the intended deposition locations on the silicon wafer. An unexpected result of the radially offset structure for the shadow mask is that even if the mask and wafer are not maintained in a mutually concentric position, the mask's radially offset aperture pattern will reduce the average total misalignment and the maximum misalignment over all of the mask apertures and predeposited wafer structures.

Figure 1:
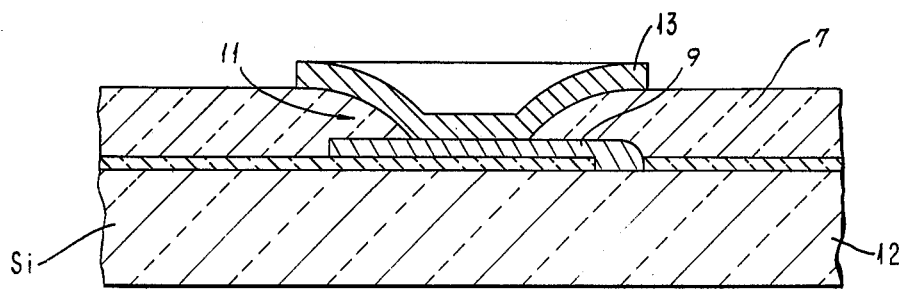
FIG. 1 is a cross-sectional view of a prior art semiconductor substrate and metal electrode layer structure.
Figure 2:
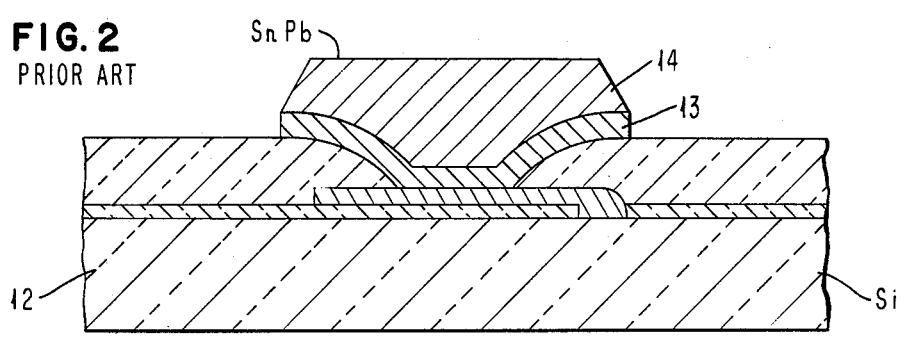
FIG. 2 is a cross-sectional view of the prior art structure of FIG. 1, after a layer of solder has been deposited on the electrode.
Figure 3:
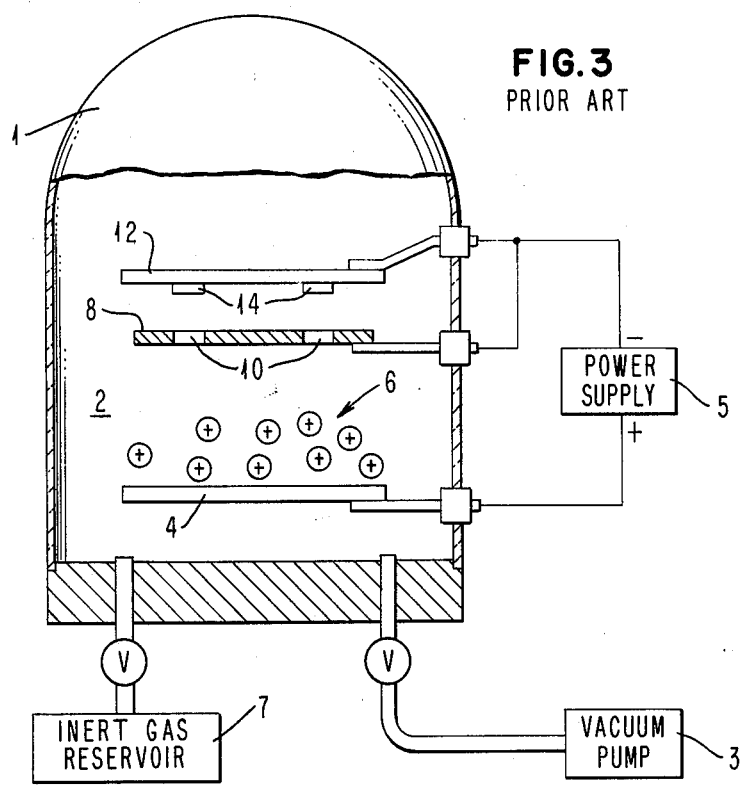
FIG. 3 is a side break-away view of a prior art vacuum sputtering and plating apparatus.

The overall deposition operation is depicted in FIG. 3 where the relative positions of the anode 4 (which doubles as the metal evaporating crucible), the shadow mask 8, and the silicon semiconductor wafer 12 are shown located within the vacuum chamber 2. When the operation commences, the electrodes 9 on the semiconductor substrate 12 must be cleaned prior to the vacuum evaporative deposition of the metal alloy layer 13 and the tin lead solder layer 14. This is accomplished by the sputter etching process wherein positive ions of the inert gas are accelerated through the mask 8 windows 10 so as to impinge upon the semiconductor substrate 12. This operation raises the temperature of the molybdenum mask 8 and the semiconductor substrate 12 to approximately 300° C. In order to overcome the adverse effects of the differential thermal expansion between the silicon wafer 12 and the molybdenum mask 8, the shadow mask 8 has the following inventive structure.

As can be seen in FIG. 4, the shadow mask 8 is a planar plate having a pattern of apertures 10 therethrough. Since the structures 14 on the silicon wafer 12 and the apertures 10 on the shadow mask 8 must be aligned after the assembly's temperature has been raised $\Delta T$ degrees from room temperature to the operating temperature, the respective distance R of each aperture 10 from the centroid 20 of the plate 8 at room temperature, is reduced a distance $\Delta R$ with respect to the corresponding desired distance r of the shadow image 14 on the silicon wafer at room temperature, by approximately the product of $\Delta T$ times r times the difference between the thermal coefficient of expansion $\alpha_{Mo}$ of the material of plate 8 and the thermal coefficient of expansion $\alpha_{Si}$ of the wafer 12. It can be seen with reference to FIGS. 4 and 5 that at room temperature, the location of the deposited layer 14a through 14g is at the desired position r for accurate registration with a circuit module contact pattern, but that the apertures 10a through $10g$ in the shadow mask 8 are misregistered at a position R. It is one aspect of the invention that this misregistration is intentionally introduced into the shadow mask 8 so that the respective distances of the apertures 10 with respect to the centroid 20 of the plate 8 is reduced with respect to the corresponding desired distances r of the shadow images on the silicon wafer so as to anticipate the effect of the difference in the thermal coefficient of expansion between the mask 8 and the wafer 12 when they are raised $\Delta T$ degrees to the elevated deposition temperature.

In this manner, when the plate 8 and the silicon wafer 12 are raised to the operation temperature for the sputter etch cleaning and the vacuum deposition steps, the differential expansion of the plate material in the mask 8 and of the silicon wafer 12, will bring the apertures therein into alignment with the intended deposition locations on the silicon wafer 12. This enables the accurate alignment of the deposited layer 14 on large diameter silicon wafers.

The exact relationship between R and r can be derived as follows. R is the distance of the center of an aperture 10 in mask 8 from the axis 20 of the centroid for the mask at room temperature. And r is the distance of the center of a structure 14 on the silicon wafer 12 from the axis 20 of the centroid for the wafer at room temperature. When the mask 8 and the wafer 12 have their temperature raised $\Delta T$ degrees to the operating temperature for the process, the mask expands at a first rate so that R takes on a larger value $R^1$ and the wafer expands at a second rate so that r takes on a larger value $r^1$. The expressions for $R^1$ and $r^1$ are $$R^1 = R + R\alpha_{Mo}\Delta T \quad (1)$$

and $$r^1 = r + r\alpha_{Si}\Delta T \quad (2)$$

Since it is desired that the aperture 10 and the structure 14 be aligned at the elevated operating temperature, set $$R^1 = r^1 \quad (3)$$

Substituting expressions (1) and (2) for (3) and simplifying:

$$R(1 + \alpha_{Mo}\Delta T) = r(1 + \alpha_{Si}\Delta T) \quad (4)$$

$$R = r\left(\frac{1 + \alpha_{Si}\Delta T}{1 + \alpha_{Mo}\Delta T}\right) \quad (5)$$

Equation (5) is the exact relationship between R and r which can be used to construct the mask from the wafer dimensions r.

Equation (5) can be simplified by approximation as follows. Let $$\Delta R = R - r. \quad (6)$$

Then $$\Delta R = r\left(\frac{1 + \alpha_{Si}\Delta T}{1 + \alpha_{Mo}\Delta T}\right) - r. \quad (7)$$

which can be rewritten as $$\Delta R = r\Delta T\left[\frac{\alpha_{Mo} - \alpha_{Si}}{1 + \alpha_{Mo}\Delta T}\right]. \quad (8)$$

Since $$1 >> \alpha_{Mo}\Delta T. \quad (9)$$

for $\Delta T$ having values on the order of 300° C., then $$\Delta R \approx r\Delta T(\alpha_{Mo} - \alpha_{Si}). \quad (10)$$

The approximation of expression (10) will confer less than 1% error to the calculated value of $\Delta R$ over the value calculated from equation (8).

An example of the design of an aperture 10 in a mask 8 based upon the desired resultant location of the structure 14 on the wafer 12 is as follows.

A structure 14 is desired to be deposited on a 5-inch diameter silicon wafer at $r = 2.20000 \pm 0.00001$ inches from the center of the wafer. A molybdenum mask is to be employed in a 300° C. sputter-etch cleaning and vacuum plating operation. The (room temperature) distance R of the mask aperture from the center of the mask is calculated as follows. Equation (S) is $$R = r\left(\frac{1 + \alpha_{Si}\Delta T}{1 + \alpha_{Mo}\Delta T}\right). \quad (S)$$

$\Delta T = 300° C. - 25° C.$ (room temperature) $= 275° C.$ $\alpha_{Si} = 3.0 \times 10^{-6}/C°.$ $\alpha_{Mo} = 5.5 \times 10^{-6}/C°.$ and $r = 2.20000 \pm 0.00001$ inches.

Thus $$R = 2.20000\left(\frac{1 + 3.0 \times 10^{-6} \times 275}{1 + 5.5 \times 10^{-6} \times 275}\right)$$

$$R = 2.20000\left(\frac{1.000825}{1.001512}\right)$$

$$R = 2.20000 \times 0.99931$$

$R = 2.19848$ inches.

By making the mask 8 with its aperture 10 located at the distance R from the mask centroid 20, the structure 14 can be deposited during the hot processing step with a high degree of positional accuracy.

The above derivation assumes a uniformly radial expansion of the mask 8 and the wafer 12 about their coaxial centroids 20, a condition which can be achieved by the fixture disclosed by C. E. Benjamin in the above-referenced publication. It can be shown from what follows, however, that even without the radially symmetric expansion of the mask and wafer about their centroids, the inventive mask structure disclosed herein will reduce the average misalignment of the wafer 12 and the mask 8 over all of the apertures 10 and structures 14.

This analysis will consider two shadow mask structures, the first having no correction applied to its apertures and the second having the radially offset aperture pattern in accordance with the invention. Since only the relative motion between the mask and wafer is of concern, the analysis will be simplified by attributing all of the differential expansion to the mask and none to the wafer for temperature excursions.

With reference to FIG. 4, let the X-axis be defined as the horizontal line coincident with the centers of the mask apertures 10f and 10g and directed toward 10g. Let the Y-axis be defined as the vertical line coincident with the centers of the mask apertures 10d and 10b and directed toward 10b. Furthermore, let the centers of the apertures 10b, 10d, 10f and 10g be equidistant from the mask centroid 20.

For an uncorrected shadow mask, the centers of the apertures 10b, 10c, 10d, 10f and 10g will be coincident with the wafer structures 14b, 14c, 14d, 14f and 14g, respectively, at room temperature. Let the centers of the mask aperture 10b and the wafer structure 14b remain coincident as the temperature of the assembly rises $\Delta T$ degrees. Furthermore, let the differential expansion of the mask over $\Delta T$ result in an increment of $\Delta P$ in the distance between the center of the mask aperture 10b and the mask centroid 20. Then, by inspection, the center of aperture 10c will be misaligned by $-\Delta p$ in the y-direction with respect to the center of wafer structure 14c and aperture 10d will be misaligned by $-2\Delta p$ in the y-direction. The center of aperture 10f will be misaligned by $-\Delta p$ in the x-direction and $-\Delta p$ in the y-direction which results in a net displacement which is the vector sum of $\sqrt{2}\Delta p$. Similarly, the center of aperture 10g will be misaligned by $\sqrt{2}\Delta p$. Thus, for these five mask apertures in an uncorrected mask, the sum of the magnitudes for the misalignments is $5.8\Delta p$ and the largest magnitude for any misalignment is $2\Delta p$.

For a shadow mask structure having the radially offset aperture pattern in accordance with the invention, the center of the central aperture 10c will be coincident with the central wafer structure 14c. The centers of the mask apertures 10b, 10d, 10f and 10g will be radially offset from the centers of the wafer structures 14b, 14d, 14f and 14g at room temperature in accordance with the invention, as follows. Aperture 10b is offset by $-\Delta p$ in the y-direction and aperture 10d is offset by $+\Delta p$ in the y-direction. Aperture 10g is offset by $-\Delta p$ in the x-direction and aperture 10f is offset by $+\Delta p$ in the x-direction. Let the center of the mask aperture 10b remain fixed with respect to the juxtaposed portion of the wafer structure 14b (at an offset of $-\Delta p$ in the y-direction) as the temperature of the assembly rises $\Delta T$ degrees, in the same manner as that for the previous example of an uncorrected mask. Then, by inspection, the center of the aperture 10c will be misaligned by $-\Delta p$ in the y-direction with respect to the center of wafer structure 14c and aperture 10d will be misaligned by $-\Delta p$ in the y-direction. The center of aperture 10f will be misaligned by zero in the x-direction and $-\Delta p$ in the y-direction. Similarly, the center of aperture 10g will be misaligned by zero in the x-direction and $-\Delta p$ in the y-direction. Thus, for these five mask apertures in the radially offset aperture pattern in accordance with the invention, the sum of the magnitudes for the misalignments is $5\Delta p$ and the largest magnitude for any misalignment is $\Delta p$.

By the above, it is seen that the shadow mask structure having the radially offset aperture pattern in accordance with the invention has the unexpected result of significantly reducing the maximum misalignment and average or total misalignment even if the mask and wafer are not maintained in a mutually concentric position over changes in temperature. This is true for the more general case of the clamped, mutually stationary point of the mask and wafer being randomly located on the mask/wafer composite.

Although a specific embodiment of the invention has been disclosed, it will be understood by those of skill in the art that the foregoing and other changes in form and detail may be made therein without departing from the spirit and scope of the invention.

Having thus described our invention, what we claim as new, and desire to secure by Letters Patent is:

1. An improved high temperature shadow mask for a large diameter silicon wafer, comprising:
    a planar plate having a pattern of apertures misregistered at room temperature but registered at high temperature during a deposition process each of whose respective distances from the centroid of said plate at room temperature is misregistered with respect to the corresponding desired distance from the centroid of said wafer of a corresponding shadow image on the silicon wafer at room temperature, by approximately the product of the difference between said high temperature and said room temperature times said desired distance times the difference between the thermal coefficient of expansion of the plate material and the thermal coefficient of expansion of the silicon wafer;
    whereby when the plate and silicon wafer are raised to said high temperature for processing, the differential expansion of the plate material will bring the apertures therein into alignment with the intended deposition locations on the silicon wafer.

2. An improved high temperature shadow mask for a large diameter silicon wafer, comprising:
    a planar plate having a pattern of apertures misregistered at room temperature but registered at high temperature during a deposition process, each of whose respective distances from the centroid of said plate at room temperature is misregistered with respect to the corresponding desired distance from the centroid of said wafer of a corresponding shadow image on the silicon wafer at room temperature, by approximately the product of the difference between said high temperature and said room temperature times said desired distance times the difference between the thermal coefficient of expansion of the plate material and the thermal coefficient of expansion of the silicon wafer; whereby when the plate and silicon wafer are clamped in a fixture which does not maintain said plate centroid and said wafer centroid mutually coincident at said high temperature and are raised to said high temperature for processing, the differential expansion of the plate material will bring the apertures therein into a minimum total misalignment with the intended deposition locations on the silicon wafer.

3. A method for making an improved high temperature shadow mask assembly for a large diameter silicon wafer, comprising the steps of:
    forming a planar plate having a pattern of apertures misregistered at room temperature but registered at high temperature during a deposition process, each of those respective distances from the centroid of said plate at room temperature is misregistered with respect to the corresponding desired distance from the centroid of said wafer of a corresponding shadow image on the silicon wafer at room temperature, by approximately the product of the difference between said high temperature and said room temperature times said desired distance times the difference between the thermal coefficient of expansion of the plate material and the thermal coefficient of expansion of the silicon wafer;

clamping said plate and said wafer with their said centroids mutually coincident, in a fixture which does not maintain their said centroids mutually coincident at said high temperature;

raising the temperature of said plate and silicon wafer to said high temperature for processing;

whereby the differential expansion of the plate material will bring the apertures therein into a minimum total misalignment with the intended deposition locations on the silicon wafer.

* * * * *